United States Patent

[11] 3,551,761

[72] Inventors Carl E. Ruoff
Appalachin;
Edward F. Winter, Endicott, N.Y.
[21] Appl. No. 752,317
[22] Filed Aug. 13, 1968
[45] Patented Dec. 29, 1970
[73] Assignee International Business Machines Corporation
Armonk, N.Y.
a corporation of New York

[54] INTEGRATED PHOTODIODE ARRAY
3 Claims, 5 Drawing Figs.

[52] U.S. Cl. 317/235, 317/234; 340/173; 307/311
[51] Int. Cl. H01l 15/00, H01l 19/00
[50] Field of Search 317/235/22.1, 235/22.11, 235/27, 235/22, 235/43, 235(Inquired); 307/311; 340/173LSS

[56] References Cited
UNITED STATES PATENTS

| | | | |
|---|---|---|---|
| 3,488,636 | 1/1970 | Dyck | 340/173 |
| 3,432,670 | 3/1969 | Dym | 250/211 |
| 3,430,110 | 2/1969 | Goshgarian | 317/234 |
| 3,341,755 | 9/1967 | Husher et al. | 317/235 |
| 3,423,255 | 1/1969 | Joyce | 148/175 |
| 3,265,905 | 8/1966 | McNeil | 307/88.5 |

*Primary Examiner*—John W. Huckert
*Assistant Examiner*—Martin H. Edlow
*Attorneys*—Hanifin and Jancin and J. Jancin, Jr.

ABSTRACT: A monolithic integrated circuit chip having a matrix of photosensitive cells in a wafer material. The photosensitive cells are arranged so that they may be selected in a columnar fashion. Each cell is isolated within the chip and consists of a multianode common cathode photosensitive structure.

INVENTOR
CARL E. RUOFF
EDWARD F. WINTER
BY J. Jancin Jr.
ATTORNEY

INTEGRATED PHOTODIODE ARRAY

BACKGROUND OF THE INVENTION

The present invention relates to a monolithic integrated photodiode array. More particularly, to a monolithic photodiode array which provides a matrix of light sensitive points of a high resolution capable of scanning a light pattern in two dimensions.

In the present state of the photoscanning art, photodetection is achieved by having an individual photosensitive element positioned at every point that is to be resolved and sensed. Each of these photosensitive elements may consist of a single element such as a phototube, photodiode, phototransistor, scanistor, or any other photosensitive device which modulates a signal by means of light energy. Since each point to be detected requires its own individual element, size of present scanning systems are relatively large with respect to the resolution of the material which is to be scanned.

Therefore, resolution in present photosensitive arrays is limited to the size of the individual photosensitive element.

It is generally known that arrays of photosensitive elements may be arranged in any pattern desired to facilitate the scanning process. However, if the light image that is to be resolved may take various forms, it is necessary to utilize a general purpose configuration such as a matrix. Present state of the art photodiode arrays provide a matrix of individual photodiodes which detect the presence of light at each cell.

All the cells in the array are arranged in a matrix circuit so as to cover all points in the X–Y plane. When a light pattern is imposed on the matrix, those photodiodes which detect light are turned "ON" and those that detect the absence of light remain in the "OFF" condition. The particular condition of all photodiodes is then decoded so as to determine the light information which was incident on the plane of photodiodes. A photodiode array as presently used in the state of the art systems is disclosed in U.S. Pat. No. 3,197,736 granted on July 27, 1965.

It is also well known in the state of the art that a PN junction arrangement of semiconductor material may be formed in a monolithic block. This PN junction may be made so as to form a modulating section. By providing a suitable potential gradient across this modulating section it is possible to make the PN junction responsive to a threshold level of light energy. The diode formed by this PN junction will become conductive or turned to an "ON" condition when the section is exposed to this threshold level of light energy.

Generally this PN junction arrangement is incorporated into a single crystal substrate of semiconductor material and subjected to crossfield biasing or modulation to perform desired switching, scanning and related functions. These PN junctions may be formed in a larger semiconductor wafer so as to form groups of individual photodiodes in a single wafer. However, present photodiode monolithic structures are limited to a single diode within each cell of the monolithic structure.

It is therefore a primary object of the present invention to provide an improved photosensitive array.

Another object of the present invention is to provide a monolithic integrated circuit containing a photodiode array.

Another object of the present invention is to provide a photodiode array having a columnar type selection scheme.

A further object of the present invention is to provide a multianode common cathode monolithic photodiode array.

The foregoing and other objects, features and advantages of the invention will be apparent from the following and more particular description of a preferred embodiment of the invention, as illustrated in the accompanying drawings.

In accordance with this invention, a monolithic integrated circuit chip is provided having a matrix of photosensitive cells in a wafer material. The photosensitive cells are arranged so that they may be selected in a columnar fashion. This provides for the ability to scan light conditions appearing within a surface area the size of the ship. That is, a two-dimensional cell arrangement within the chip structure is capable of resolving the appearance of a light condition in the area of each corresponding cell. Each cell structure is isolated from the other cells within the chip and is therefore able to respond only to the light energy corresponding to the cell position.

The scanning wafer is intended to sense the presence or absence of low level illumination falling upon a matrix of 10 mil diameter spots arranged on a 15 × 15 mil grid pattern. The light of interest has a wavelength similar to the wavelength of the spectral absorption of silicon. This particular spectral absorption provides for silicon processing technology to be applied to fabricating large integrated arrays of photocells to sense the wavelength radiation. The illumination state of cells at the array is sensed one column at a time by addressing a drive line of the particular column in question and examining the states of those sense lines which are orthogonal to the drive lines of the array. A bank of sense amplifiers is fixed in an orthogonal manner to the drive lines so as to sense the detection of light at any one particular cell.

Each cell within the array consists of three diodes formed in such a manner so that they have a common cathode. A buried island of N+ material is embedded in a wafer of P material. Over this buried island, an epitaxial layer of intrinsic material is deposited. Into this structure there is formed three P+ regions so as to form three PN junctions with the intrinsic material forming the depletion region. One of the regions forms an isolation diode and performs the function of presenting a high impedance from cell to cell. The other two regions form photodiode and blocking diode junctions with the intrinsic material. The buries island material serves as a common cathode for all three diodes. Once this structure is developed, the arrangement of the X–Y array is accomplished by a subsequent aluminum vacuum deposition and by a substrative etching process.

DETAILED DESCRIPTION OF THE INVENTION

Figure 1:
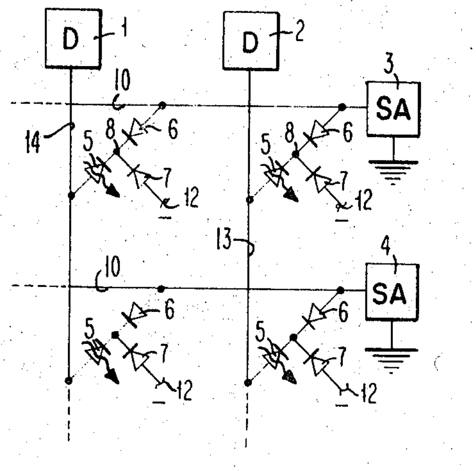
FIG. 1 is a schematic representation of a section of the monolithic integrated photodiode array.

Referring to FIG. 1, there is shown an electrical schematic of four cells arranged in a two-dimensional array. The associated drivers 1 and 2 and the sense amplifiers 3 and 4 are shown in block diagram form. The common cathode arrangement of the three diodes 5, 6, and 7 are shown as being commonly connected at their cathodes at point 8. Diode 5 is a photodiode, diode 6 is a blocking diode, and diode 7 is an isolation diode.

Each of the sense lines 10 represented by horizontal lines in FIG. 1 are terminated by the input impedance of the sense amplifiers 3 and 4 which are referenced at ground potential. In order to completely isolate all of the photodiode cells, a negative potential is applied to the anode 12 of the isolation diodes. This minimizes the isolation junction capacitance and completely isolates all of the photodiode cells by reverse bias junctions. Photodiodes 5 in the vertical column of cells to be read are reversed biased by a negative pulse on the drive line 13. All other drive lines 14 are maintained at a positive potential which insure that the blocking diodes of all cells except those in the selected column are reversed biased, thus blocking a possible photosignal from entering the sense lines. Blocking diodes 6 in the selected column are forward biased and are ready to transmit a photosignal from their respective reverse biased photodiodes 5 to the sense lines 10 and ultimately on to the sense amplifiers 3 and 4.

Figure 2:
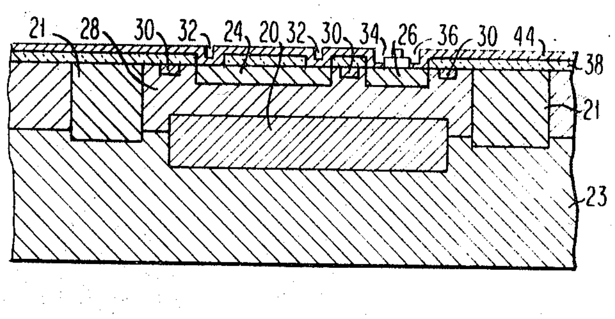
FIG. 2 is a sectional view of a photodiode cell structure made according to the invention.

Referring now to FIG. 2, there is shown a cross section of an individual cell within the photodiode array. The electrical configuration of each cell is realized by having a common N+ region 20 as the common cathode for all three diodes. This common N+ region is of different type of semiconductive material than the P wafer body semiconductor material 23.

Furthermore, this common N+ region is in the form of a buried island and provides a high conductivity path through which the three cathodes of the cell are interconnected. The deep P+ isolation diffusion material 21 marks off and isolates via a diode junction which is normally reverse biased, a 14.5 × 14.5 mil square area of the intrinsic epitaxial material 28 which is extremely lightly N doped. The P+ isolation diffusion material 21 has a lower resistivity than P body material 23. Into this square area two P+ anode diffusions 24 and 26 are placed during one diffusion step to create a large photodiode junction at the interface of P+ material 24 and intrinsic material 28 and a small blocking diode junction at the interface of P+ material 26 and intrinsic material 28. Both P+ anode materials 24 and 26 have a lower resistivity than P body material 23. The small blocking diode junction also serves as an underpass diffusion. The last diffusion step is the deposition of a shallow N+ guard ring diffusion 30 which eliminates surface leakage and reduces the $\beta$ current amplification of the lateral PNP structure to a low level The $\beta$ reduction occurs because electron-hole combination within the N+ diffused regions is much greater than that in the surrounding intrinsic region and therefore, base transport in the lateral PNP structures is much less. It is significant to reduce the current amplification of the PNP structures in order to have uniformity of sensitivity of the cells within the wafer structure.

Figure 3:
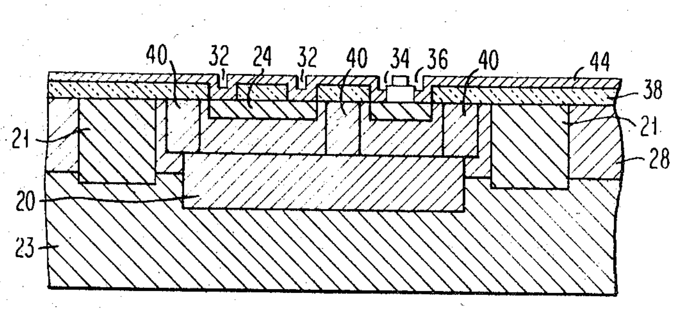
FIG. 3 is a sectional view of an improved cell structure.

Referring now to FIG. 3 there is shown a cross-sectional view of a modified cell structure which is more effective in eliminating the parasitic PNP $\beta$ current amplification. The N+ guard rings 40 in this structure are very deep, touching the N+ buried island 20. Fabrication of this "bathtub" structure is accomplished by performing the N+ guard ring diffusion before the P+ anode diffusion.

In both structures shown in FIGS. 2 and 3, three contact holes 32, 34, and 36 are etched through the silicon dioxide insulating layer 38 for interconnection of the cells into an X–Y array via a subsequent aluminum vacuum deposition and a substractive etching process. The aluminum interconnecting lines are shown as layer 44. The contact holes 32 completely surround the large P+ photodiode anode 24. Thus contact of the anode diffusion is possible at its periphery. The other two contact holes 34 and 36 are at either end of the blocking diode P+ anode 26. Thus the anode 26 can serve as a diffused crossunder and the X–Y array is capable of being wired with a single layer of metal interconnection lines shown as layer 44.

FURTHER EXTENSIONS OF THE INVENTION

Figure 4:
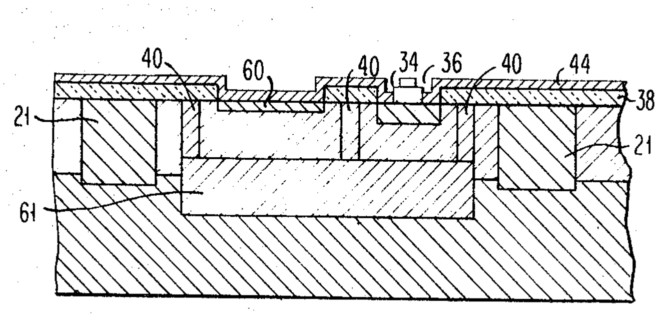
FIGS. 4 and 5 are sectional views of alternative embodiments of a cell structure.
Figure 5:
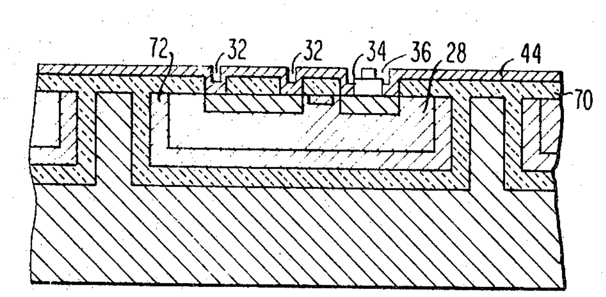

The cell structure disclosed in FIGS. 2 and 3 has an extremely high access speed within the range of 100 nanoseconds. However, a greater sensitivity is accomplished by employing improved structures as shown in FIGS. 4 and 5. A thicker intrinsic epitaxial layer would result in a lower junction capacitance for the photodiode and the blocking diode. The thickness of the epitaxial layer in the structure shown in FIGS. 2 and 3 are in the order of 12 to 15 microns and this leads to a vertical distance of 7 to 10 microns between the P+ anode diffused region 24 and the N+ buried island region 20. Increase of this distance to more than 15 microns would result in a significant reduction in photodiode and blocking diode capacitance. This in turn would result in an improvement in photosensitivity. Increase in photosensitivity is more significant for long wavelength light and this sensitivity is found to increase as the wavelength increases from about .8 to 1.1 microns. The longer wavelengths of light penetrate silicon crystal more readily than the shorter. Therefore, a deeper depletion region is more effective in absorbing long wavelength light because light intensity at any given source power and depth is greater at longer wavelengths.

Referring now to FIG. 4, there is shown a cross section of an improved cell structure. Shown within this FIG. is a reduction of the depth of P+ photodiode anode diffused region 60. Depth reduction of the P+ diode anode 60 directly effects both the speed and sensitivity of the cell. Hole-electron pairs, which are created within the P+ anode diffused region 60 as a result of light incident upon the cell are diffused throughout the P+ region. Electrons which diffuse to the P+ intrinsic junction are swept toward the N+ buried island 61 by the high E field of the depletion region and thus contribute to the photocurrent.

Diffusion is a slow process relative to transit time within the depletion region, and therefore this mechanism of diffusion should be minimized if high speed is desired. The combination of some of the newly created electrons with holes of the P+ region occurs as the electrons diffuse toward the junction. This condition reduces sensitivity. At long wavelengths, a small amount of light is absorbed by the 1.5 micron P+ region 60. In this case most of the light is absorbed in the depletion region but at short wavelengths it is absorbed in the anode region. Thus electron diffusion and recombination effects become very important. An effective reduction in hole-electron diffusion time is achieved by separation of the P+ photodiode and blocking diode anode diffusion into two fabrication steps. This will result in a very thin photodiode anode 60 and a lower resistivity blocking diode P+ diffusion. A suitable silicon dioxide cover layer of .2 to .3 microns deep will result in a blocking diode which may also be useful as a "crossunder."

Now referring to FIG. 5, there is shown a structure which can incorporate either or both of the improvements mentioned with regard to FIG. 5. That is, a thicker epitaxial region resulting in wider photo and blocking diode depletion regions and a shallow photodiode P+ anode region. This offers improved speed and sensitivity. Isolation of the photocells is accomplished by insulating silicon dioxide 70 instead of using a reverse bias photodiode junction as in the previous three embodiments disclosed. By using this silicon dioxide for presenting an infinite impedance between cells, the structure will reduce the isolation junction capacitance by a factor of 10 to 20 and thereby improve speed. Since the intrinsic material 28 in which the cell is fabricated can now be a drawn crystal rather than an epitaxial layer, it can have a higher resistivity. By this means the photodiode and blocking diode junction capacitance can be further reduced. The encircling N+ buried island 72 provides a lower resistance path between the two photodiode cathodes in each cell. Thus there is a further improvement in speed realized.

OPERATION OF THE INVENTION

In the operation of the invention the photodiode array as schematically represented in FIG. 1 is placed so as to have the light image to be scanned fall incident on the plane of the array. Each cell within the array detects the presence or absence of light information at the 10 mil X–Y position corresponding to the position of the cell. When it is desired to commence scanning, each of the drivers on the array sequentially send a negative pulse on the drive lines. For example, driver 1 would send the first pulse so that the condition of light that appears on the first column of cells is detected at the sense amplifiers for the entire column. During the scanning of the first column of cells all other drivers are held at a positive potential so as to block the detection of light in the other columns. After the entire column of light signals has been detected, the next driver 2 sends a negative pulse and all other drivers are held at a positive potential. This process continues until all the columns of cells have been sensed.

One possible utilization of the photodiode array disclosed is in the operation of read only storage memory. In such a memory, each column of cells would represent a byte of data and each cell would represent a bit of information being in either the "ON" or "OFF" state. Another possible use of this monolithic photodiode array would be in the technology of character recognition. With the high resolution capabilities of the present invention, recognition of extremely small character information would be possible.

While the invention has been particularly shown and described with reference to the preferred embodiment thereof, it will be understood by those skilled in the art that various changes in form and details may be made therein without departing from the spirit and scope of the invention.

We claim:

1. A photoelectric device for detecting and resolving light information comprising:

a body of semiconductive material of a first type of conductivity;

a plurality of cells arranged in a two-dimensional array with said body of semiconductive material;

each cell having a first region of semiconductive material of a second type of conductivity heavily doped for low resistivity, said first region extending into a portion of said body of semiconductive material;

an intrinsic layer of material of said second type of conductivity having a very high resistivity, said epitaxial layer extending over said body of semiconductive material;

a second region of semiconductive material of said first type of conductivity having less resistivity than said body material, said second region isolating an epitaxial region above said first region;

a third region of semiconductive material of said first type of conductivity having less resistivity than said body material, said third region being embedded in said epitaxial region and forming a photosensitive junction between said epitaxial region and said third region;

a fourth region of semiconductive material of said first type of conductivity having less resistivity than said body material, said fourth region being embedded in said epitaxial region and adjacent to said third region and forming a blocking junction between said epitaxial region and said fourth region;

said epitaxial layer forming a common high resistive cathode for the three junctions formed with the second, third and fourth regions, said first region providing a low-resistive path between said junctions and said common cathode;

a layer of insulating material covering said epitaxial region of material and said third and fourth regions; and a plurality of openings in said insulating material extending into said third and fourth regions for providing the placing of electrical connections to said third and fourth regions and light energy means impinging upon said third region for forming a photosensitive junction between said epitaxial region and said third region, and a plurality of drive lines and sense lines interconnecting said cells so as to form a matrix array.

2. The structure as defined in claim 1 further comprising: a fifth region of semiconductive material of the same type of conductivity as said first region embedded between said second and third and between said third and fourth regions so as to form guard rings around the third and fourth regions.

3. A photoelectric device for detecting and resolving light information comprising:

a body of semiconductive material of a first type of conductivity;

a plurality of cells arranged in a two-dimensional array with said body of semiconductive material;

each cell having a first region semiconductive material of a second type of conductivity heavily doped for low resistivity, said first region extending into a portion of said body of semiconductive material;

an intrinsic epitaxial layer of material of said second type of conductivity having a very high resistivity, said epitaxial layer extending over said first region of semiconductive material;

a second region of insulating material completely surrounding and isolating said first region and an epitaxial region above said first region;

a third region of semiconductive material of said first type of conductivity having less resistivity than said body material, said third region being embedded in said epitaxial region and forming a photosensitive junction between said epitaxial region and said third region;

a fourth region of semiconductive material of said first type of conductivity having less resistivity than said body material, said fourth region being embedded in said epitaxial region and adjacent to said third region and forming a blocking junction between said epitaxial region and said fourth region;

said epitaxial layer forming a common high resistive cathode for the two junctions formed with the third and fourth regions, said first region providing a low resistive path between said junctions and said common cathode;

a layer of insulating material covering said epitaxial region of material and said third and fourth regions; and a plurality of openings in said insulating material extending into said third and fourth regions for providing the placing of electrical connections to said third and fourth regions and light energy means impinging upon said third region and a plurality of drive lines and sense lines interconnecting said cells so as to form a matrix array.